United States Patent [19]

Hirai et al.

[11] Patent Number: 5,437,952
[45] Date of Patent: Aug. 1, 1995

[54] LITHOGRAPHIC PHOTOSENSITIVE PRINTING PLATE COMPRISING A PHOTOCONDUCTOR AND A NAPHTHO-QUINONE DIAZIDE SULFONIC ACID ESTER OF A PHENOL RESIN

[75] Inventors: Katsura Hirai, Hachioji; Yasuo Kojima, Tama; Kiyoshi Goto, Hachioji, all of Japan

[73] Assignee: Konica Corporation, Tokyo, Japan

[21] Appl. No.: 22,918

[22] Filed: Feb. 26, 1993

[30] Foreign Application Priority Data

Mar. 6, 1992 [JP] Japan .................................. 4-049849
Apr. 3, 1992 [JP] Japan .................................. 4-082246

[51] Int. Cl.⁶ ........................ G03G 5/09; G03F 7/023
[52] U.S. Cl. .................................... 430/83; 430/49; 430/56; 430/96; 430/165; 430/190; 430/191; 430/192; 430/193
[58] Field of Search ............... 430/190, 191, 192, 193, 430/165, 49, 96, 56, 83

[56] References Cited

U.S. PATENT DOCUMENTS

| | | | |
|---|---|---|---|
| 3,635,709 | 1/1972 | Kobayashi | 430/190 |
| 3,658,662 | 4/1972 | Casson, Jr. et al. | 204/58 |
| 4,492,740 | 1/1985 | Yamamoto et al. | 430/192 |
| 4,544,627 | 10/1985 | Takahashi et al. | 430/190 |
| 4,680,244 | 7/1987 | Lehman et al. | 430/49 |
| 4,840,869 | 6/1989 | Kita et al. | 430/190 |
| 4,897,329 | 1/1990 | Nakayama | 430/49 |
| 4,933,248 | 6/1990 | Lind et al. | 430/49 |
| 5,110,706 | 5/1992 | Yumoto et al. | 430/192 |

*Primary Examiner*—Charles L. Bowers, Jr.
*Assistant Examiner*—John S. Chu
*Attorney, Agent, or Firm*—Finnegan, Henderson, Farabow, Garrett & Dunner

[57] ABSTRACT

A photosensitive lithographic printing plate comprises a conductive support and provided thereon, a photoconductive layer of a composition comprising a photoconductor and an esterified compound of o-naphthoquinonediazide sulfonic acid with a phenol resin, the phenol resin being a polycondensation compound of a monovalent phenol with an aldehyde or a ketone, and the content of the o-naphthoquinonediazide sulfonic acid residue being $0.4 \times 10^{-3}$ to $3.0 \times 10^{-3}$ mole per gram of the photoconductive layer.

14 Claims, No Drawings

LITHOGRAPHIC PHOTOSENSITIVE PRINTING PLATE COMPRISING A PHOTOCONDUCTOR AND A NAPHTHO-QUINONE DIAZIDE SULFONIC ACID ESTER OF A PHENOL RESIN

FIELD OF THE INVENTION

The present invention relates to a photosensitive lithographic printing plate having on a conductive support a photoconductive layer containing a photoconductor and a quinonediazide compound, which becomes a lithographic printing plate through the procedure of toner image formation on said photoconductive layer by an electrophotographic process, overall exposure of the plate, and elution development.

BACKGROUND OF THE INVENTION

As a method for making a lithographic printing plate by electrophotography, there is known a technique to make a lithographic plate by forming toner images on a photoconductive layer provided on a support of a lithographic photosensitive printing plate and, then, removing non-image portions of the photoconductive layer using an etchant.

However, the above technique has a disadvantage called side etching, in which an etchant permeates from non-image portions of a photoconductive layer into image portions, or portions of the photoconductive layer located beneath toner images, and removes these image portions and, thereby lowers the reproducibility and stability of images. In other words, characters and fine lines are thinned as side etching proceeds, and when a halftone photograph original is used, gradation reproducibility is deteriorated, making delicate reproduction of highlights or shadows difficult. And in color printing, color reproducibility also becomes insufficient. Another problem of this technique is a fluctuation of etching ability due to variation of activities of an etchant; this affects side etching and make it difficult to manufacture stably printing plates having a prescribed quality. Further, when side etching is controlled to improve such image reproducibility, removal of non-image portions of the photoconductive layer becomes insufficient and, thereby, stains become liable to occur in printing.

Photosensitive lithographic printing plates having a photoconductive layer containing a quinonediazide compound are known in the art by British Pat. No. 996,315, Japanese Pat. O.P.I. Pub. Nos. 90648/1982, 150953/1983, 194467/1985. These photosensitive lithographic printing plates become lithographic printing plates through the steps of forming toner images electrophotographically on the photoconductive layer containing a photoconductor and a quinonediazide compound, exposing the photoconductive layer through the formed toner images, and then etching the non image portions of the photoconductive layer.

However, these conventional techniques, which use a quinonediazide compound in the photoconductive layer, are not necessarily sufficient in side etching prevention and liable to cause the foregoing troubles due to side etching. Particularly, these are insufficient in gradation reproducibility and color reproducibility to provide high quality printing. Further, preparation of printing plates of uniform quality is difficult, and stains become liable to occur if side etching is controlled. Besides the above, these techniques have problems ascribed to insufficient photosensitivities and other electrophotographic properties. When the content of a photoconductor is increased to enhance the electrophotosensitivity, the irradiation time of active light for a quinonediazide compound becomes longer, protracting the processing time or causing stains in printing by unremoved residual at non-image portions of the photoconductive layer.

SUMMARY OF THE INVENTION

Accordingly, in a photosensitive lithographic printing plate comprising a conductive support having thereon a photoconductive layer containing a photoconductor and a quinonediazide compound, the object of the invention is firstly to provide a photosensitive lithographic printing plate improved in side etching prevention property and capable of providing stably a lithographic printing plate having an excellent gradation reproducibility and color reproducibility to allow high quality printing, secondly to provide a photosensitive lithographic printing plate improved in electrophotographic properties, thirdly to provide a photosensitive lithographic printing plate excellent in side etching prevention property and thereby capable of providing a lithographic printing plate free from staining, fourthly to provide a photosensitive lithographic printing plate having reduced photomechanical processing time, and fifthly to provide a photosensitive lithographic printing plate, the manufacture thereof being safety conducted and the manufacture of a printing plate therefrom also being conducted with safety.

DETAILED DESCRIPTION OF THE INVENTION

The above object of the invention is attained by the following constituents (1) or (2):

(1) A photosensitive lithographic printing plate comprising a conductive support having thereon a photoconductive layer containing a photoconductor and an esterified compound of o-naphthoquinonediazide sulfonic acid with a phenol resin, wherein the phenol resin is a polycondensation product of a monovalent phenol with an aldehyde or a ketone, and the content of the a naphthoquinonediazide sulfonic acid residue is not less than $0.4 \times 10^{-3}$ mole per gram of the photoconductive layer.

(2) A photosensitive lithographic printing plate comprising a conductive support having thereon a photoconductive layer containing a photoconductor, an esterified compound of o-naphthoquinonediazide sulfonic acid with a phenol resin, an alkali soluble resin, wherein the phenol resin is a polycondensation product of a monovalent phenol with an aldehyde or a ketone, and the content of the sulfonic acid residue is not less than $0.4 \times 10^{-3}$ mole per gram of the photoconductive layer.

Next, the invention is described in detail.

The photoconductor usable in the photoconductive layer of the invention includes an organic photoconductive pigment and a non-pigment organic photoconductor.

Examples of the organic photoconductive pigment include perylene pigments, Quinacridone pigments, bisbenzimidazole pigments, aromatic polycondensation cyclic compounds, monoazo pigments, bisazo pigments, trisazo pigments, metallic or nonmetallic phthalocyanine pigments and zinc oxide described, for example, in Japanese Pat. Exam. Pub. Nos. 2780/1965, 12671/1969, 30035/1971, 16474/1969, 30513/1973, 7434/1975, Japanese Pat. O.P.I. Pub. Nos. 18543/1972, 18544/1972, 30330/1972, 37543/1972, 11136/1974, 99142/1974, 109841/1976, 134632/1979, 11715/1980, 105254/1980, 153948/1980, 161250/1980, 1944/1981, 2352/1981, 9752/1981, 19063/1981, 29250/1981, 69644/1981, 50050/1981, 12575/1984, 170862/1984, 176756/1984, 224846/1984, 17751/1985, 17752/1985, 17753/1985, 17754/1985, 17755/1985, 17756/1985, 17757/1985, 17758/1985, 17759/1985, 17760/1985, 17761/1985, 17762/1985, 35750/1985, 194467/1985, 67869/1986, 67870/1986, 64266/1987, 198864/1987, 217256/1987, 97965/1988, 97966/1988, 226667/1988, 226668/1988, 257862/1989, 260464/1989, 269944/1989, 7058/1990, 188758/1990, 18875/1990, 125265/1990, 125266/1990, 102358/1991.

Examples of non-pigment organic photoconductors include those described, for example, in Japanese Pat. O.P.I. Pub. Nos. 161863/1982, 76843/1983, 100862/1983, 172649/1983, 207049/1983, 44060/1984, 121058/1984, 128559/1984, 178886/1985, 222263/1989, 161354/1989, 163752/1989, 163753/1989, 186967/1989, 186968/1989, 188865/1989, 216362/1989.

In view of photosensitivity, safelight property and heat stability, organic photoconductive pigments are advantageously used in the invention; among them, a phthalocyanine pigment, especially ε-type phthalocyanine pigment is preferable.

The content of the photoconductor is preferably 3 to 50%, and preferably 5 to 20% by weight. As the content increases, better results can be obtained in enhancement of photosensitivity and reduction of residual voltage, but stains become liable to occur in printing because components of the photoconductive layer frequently remain on the non-image portion even after etching. The etching time and the post-exposing time can be shortened by decreasing the content. The photosensitivity can be enhanced by adding a quinonediazide compound in the amount specified in the invention; accordingly, the amount of a photoconductor can be reduced and thereby stains in printing is prevented and the eluting time and the post-exposing time are shortened by the embodiment of the invention.

In the photoconductive layer of the invention, a sensitizer and a charge transfer agent can be used jointly with the above photoconductor if necessary.

The quinonediazide compound used in the photoconductive layer of the invention (hereinafter referred to as the quinonediazide compound of the invention) is an esterified compound of o-naphthoquinonediazide sulfonic acid with a polycondensation product of a monovalent phenol with an aldehyde or a ketone, and the content of the o-naphthoquinonediazide sulfonic acid residue of the o-naphthoquinonediazide sulfonic acid is not less than $0.4 \times 10^{-4}$ mole per gram of the photoconductive layer.

The upper limit of the content of the sulfonic acid residue in the quinonediazide compound is preferably $3 \times 10^{-3}$ mole per gram of the photoconductive layer. The sulfonic acid residue content of less than $0.4 \times 10^{-3}$ mole per gram of the photoconductive layer deteriorates the side etching prevention capability. The sulfonic acid content of more than $3 \times 10^{-3}$ mole worsens dark attenuation and fogging, making the photomechanical processing difficult.

In the o-naphthoquinonediazide compound of the invention, it is preferable that a sulfonic acid group is substituted at the 4- or 5- position, especially at the 4-position, for high electrophotographic properties and heat stability.

Examples of the monovalent phenols used in making the quinonediazide compound of the invention include phenol, o-cresol, m-cresol, p-cresol, 3,5-xylenol, carvacrol and thymol. Among these monovalent phenols, m-cresol and p-cresol are preferred, and p-cresol is particularly preferred for its high capabilities of enhancing electrophotosensitivity and preventing side etching.

Examples of the aldehydes used in making the quinonediazide compound of the invention include formaldehyde, benzaldehyde, acetaldehyde, crotonaldehyde and furfural. Preferred are formaldehyde and benzaldehyde. Examples of the ketones include acetone, methyl ethyl ketone, methyl acetone, methyl propyl ketone, methyl butyl ketone, methyl isobutyl ketone, methyl amyl ketone and diethyl ketone.

Preferred polycondensation products between the above monovalent phenols and aldehydes are novolak type resins; examples thereof include phenol-formaldehyde resins, o-cresol-formaldehyde resins, p-cresol-formaldehyde resins, m-cresol-formaldehyde resins, mixed m- and p-cresol-formaldehyde resins, phenol-benzaldehyde resins, m-cresol-benzaldehyde resins and p-cresol-benzaldehyde resins.

In the quinonediazide compound of the invention, the condensation ratio of the o-naphthoquinonediazide sulfonic acid to the hydroxyl group of the phenol component is 15 to 80 mole %, and preferably 20 to 60 mole %.

It is preferable that an alkali-soluble resin is contained as a binder in the photoconductive layer of the invention. As the alkali-soluble resin is preferably a novolak resin. The novolak resin content of the photoconductive layer is preferably 5 to 70% by weight, and more preferably 20 to 50% by weight.

The novolak resin is a polycondensation product between a phenol and an active carbonyl compound, and the phenol includes all of the compounds in which at least one of the hydrogen atoms bonded with an aromatic ring is substituted by a hydroxyl group. Examples thereof are phenol, o-cresol, m-cresol, p-cresol, 3,5-xylenol, 2,4-xylenol, 2,5-xylenol, carvacrol, thymol, catechol, resorcin, hydroquinone, pyrogallol, phloroglucinol and phenols substituted with an alkyl group of 1 to 8 carbon atoms. Preferred are phenol, o-cresol, m-cresol and p-cresol.

The foregoing active carbonyl compounds include aldehydes and ketones; examples thereof are formaldehyde, acetaldehyde, benzaldehyde, acrolein, furfural and acetone.

Typical examples of the novolak resins include phenol/m-cresol-formaldehyde copolycondensation resins, o-cresol/m-cresol-formaldehyde copolycondensation resins, m-cresol/p-cresol-formaldehyde copolycondensation resins, o-cresol/m-cresol/p-cresol-formaldehyde copolycondensation resins and phenol/m-cresol/p-cresol-formaldehyde copolycondensation resins.

Of these copolycondensation resins, phenol/m-cresol/p-cresol-formaldehyde copolycondensation resins are particularly preferred. In the resins, the ratio of phenol (charging ratio) is 0 to 50 wt % and preferably 5 to 30 wt %; the m-cresol to p-cresol ratio is preferably within the range of 3:7 to 7:3 (charging ratio by weight).

These novolak resins may be used singly or in combination of two or more types.

The molecular weight of the novolak resin (using polystyrene as standard) is preferably $3.00 \times 10^2$ to $7.50 \times 10^3$ in number average molecular weight (Mn)

and $1.00 \times 10^3$ to $3.00 \times 10^4$ in weight average molecular weight (Mw), especially $5.00 \times 10^2$ to $4.00 \times 10^3$ in Mn and $3.00 \times 10^3$ to $2.00 \times 10^4$ in Mw.

Measurement of the molecular weight of the novolak resin is carried out by use of gel permeation chromatography. The number average molecular weight Mn and weight average molecular weight Mw are calculated according to the method described in Morio Tsuge et al., "Journal of Japanese Chemical Society", 1972, pp. 800–805.

The mole ratio of phenols in novolak resin synthesized can be determined by pyrolysis gas chromatography. The principle, apparatus and experiment conditions of pyrolysis gas chromatography are described in Arata Tsuge, "SHIN JIKKEN KAGAKU KOZA 19, KOBUNSHI KAGAKU [I] (New Experimental Chemistry Course Vol. 19, Polymer Chemistry [I])", edited by Japanese Chem. Soc., published by Maruzen Co.(1978), pp. 474–485, and the qualitative analysis of the novolak resin by pyrolysis gas chromatography is made according to the method described in Morio Tsuge et al., "BUNSEKI KAGAKU (Analytical Chemistry)", Vol. 18 (1969), pp. 47–52.

Besides the above, there may be used, as binder resins, copolymers of an acrylate, a methacrylate, styrene or vinyl acetate with a carboxyl-group-containing monomer or an acid-anhydride-group-containing monomer such as acrylic acid, methacrylic acid, itaconic acid, crotonic acid, maleic acid, maleic anhydride or fumaric acid, for example, styrene-maleic anhydride copolymer, a styrene-maleic anhydride monoalkyl ester copolymer, a methacrylic acid-methacrylate copolymer, a styrene-methacrylic acid copolymer, a styrene-methacrylic acid-methacrylate copolymer, an acrylic acid-methacrylate copolymer, a styrene-acrylic acid-methacrylate copolymer, a vinyl acetate-crotonic acid copolymer, a vinyl acetate-crotonic acid-methacrylate copolymer; copolymers containing methacrylamide, N-vinylpyrrolidone, or a monomer having a phenolic hydroxyl group, sulfonic acid group, sulfonamido group or sulfonimido group; and a phenol resin, a partially saponified vinylacetate resin, a xylene resin and a vinylacetal resin such as polyvinylbutyral.

Among these binder resins, the copolymers comprising a monomer having an acid anhydride group or a carboxyl group as a copolymer component, and the phenol resins, are preferred, because these can give high electrophotographic properties including charge holding capacity of the photoconductive layer.

Among the copolymers comprising a monomer having an acid anhydride group, styrene-maleic anhydride copolymers are preferred. Half esters of these copolymers can also be advantageously used. Among the copolymers comprising a monomer having a carboxyl group, preferred ones are binary or more multicomponent copolymers obtained by combining acrylic acid or methacrylic acid with an alkyl ester, aryl ester or aralkyl ester of acrylic acid or methacrylic acid. Also preferred are copolymers of vinyl acetate and crotonic acid, and terpolymers of vinyl acetate, a vinyl ester of a carboxylic acid having 2 to 18 carbon atoms and crotonic acid.

Conductive supports suitable for the photosensitive lithographic printing plate of the invention are those having hydrophilic surfaces; examples thereof are aluminium plates, polymer plates laminated with aluminium, zinc plates, bimetallic plates such as copper-aluminium plates, copper-stainless steel plates, chromium-copper plates, and trimetallic plates such as chromium-copper-aluminium plates, chromium-lead-iron plates, chromium-copper-stainless steel plates.

For a support having aluminium surfaces, it is preferable that it is subjected to surface treatments such as degreasing, graining, anodizing and dipping into an aqueous solution of sodium silicate, potassium zirconium fluoride, or a phosphate.

The graining is performed by mechanical methods such as ball polishing, brush polishing, blast polishing; or by electro-chemical methods such as a treatment in a hydrochloric acid or nitric acid electrolyte bath to which a direct voltage or an alternating voltage is applied.

The anodizing is carried out by applying an electric current, using an aluminium plate as anode, to an electrolyte comprising an inorganic acid such as phosphoric acid, chromic acid, sulfuric acid or nitric acid; an organic acid such as oxalic acid or sulfamic acid; or combination thereof. The degree of anodizing is 0.1 to 10 $g/m^2$, preferably 1 to 5 $g/m^2$.

It is preferable that an aluminium plate be subjected to a dipping treatment using an aqueous solution of an organic or inorganic acid or its salt after the anodizing. Suitable organic acids are formic acid, acetic acid, propionic acid, oleic acid, succinic acid, lactic acid, tartaric acid, citric acid, benzoic acid, glutamic acid, sulfamic acid, sulfinic acid and barbituric acid. Suitable inorganic acids are sulfuric acid, nitric acid, nitrous acid, silicic acid and oxalic acid. Usable salts include salts of an alkali metal such as sodium or potassium, or ammonium salts. This dipping treatment is performed in a 0.001 to 10 wt % aqueous solution, preferably in a 0.1 to 1 wt % aqueous solution at a temperature of 50° to 200° C., preferably 80° to 150° C., for 5 seconds to 3 minutes.

The silicate electrodeposition disclosed in U.S. Pat. No. 3,658,662 is another useful method. The treatment by use of polyvinylsulfonic acid disclosed in German Offenlegungsschrift No. 1,621,478 is also useful.

These hydrophilicity providing treatments are carried out not only for making the support surface hydrophilic, but also for the purposes of avoiding a harmful reaction with a photoconductive layer to be formed thereon; as a result, retention of photoconductive layer components after elution is prevented, and thereby adhesion between the support and the photoconductive layer is improved.

In order to enhance the adhesion between the support and the photoconductive layer, there may be provided between them, if necessary, an alkali-soluble intermediate layer comprising casein, polyvinyl alcohol, ethyl cellulose, carboxymethyl cellulose, phenol resin, styrene-maleic anhydride copolymer or polyacrylic acid.

Further, there can be applied to the photosensitive lithographic printing plate of the invention conventional techniques concerning lithographic photosensitive printing plates comprising a conductive support having thereon a photoconductive layer containing a photoconductor and a quinonediazide compound. Such conventional techniques include, for example, use of a dye sensitizer, chemical sensitizer, plasticizer and overcoat layer described in Japanese Pat. O.P.I. Pub. No. 170862/1984.

In manufacturing the photosensitive lithographic printing plate of the invention, photoconductive layer components primarily comprising a photoconductor, the quinonediazide compound and a binder resin are mixed in an organic solvent and then dispersed uniformly with a ball mill, a supersonic disperser or other dispersing means.

As solvents or dispersing media used in the preparation of a coating solution for the photoconductive layer of the invention, there can be used organic solvents such as alcohols including propanol, butanol, amyl alcohol, hexanol, cyclohexanol; ketones including methyl ethyl ketone, acetone, cyclohexanone, methyl propyl ketone, and methyl isobutyl ketone, esters including methyl lactate, ethyl lactate, and butyl acetate, polyhydric alcohols and ethers or acetates thereof including ethylene glycol, propylene glycol, diethylene glycol, ethylene glycol monomethyl ether, ethylene glycol monomethyl ether acetate, ethylene glycol monoethyl ether, ethylene glycol monoethyl acetate, ethylene glycol monopropyl ether, propylene glycol monomethyl ether, propylene glycol monoethyl ether, propylene glycol monopropyl ether, propylene glycol monoisopropyl ether, propylene glycol monomethyl ether acetate, propylene glycol monoethyl ether acetate, propylene glycol monopropyl ether acetate, propylene glycol monoisopropyl ether acetate, diethylene glycol dimethyl ether, diethylene glycol diethyl ether, diethylene glycol methyl ethyl ethanol, diethylene glycol methyl ethyl ether, and diethylene glycol diethyl ether, tetrahydrofuran and dioxane.

Propylene glycol monomethyl ether, propylene glycol monomethyl ether acetate, ethylene glycol monopropyl ether, diethylene glycol dimethyl ether and diethylene glycol methyl ethyl ether and preferable in view of the above mentioned safety aspects.

In the invention, the solvent may be used singly or in combination.

The photoconductive composition so prepared is coated and dried on a conductive support to a dry coating thickness of 1 to 10 μm, preferably 1 to 5 μm. The dried support may be further subjected to heat treatment if necessary. The coating can be performed by conventional methods such as wire-bar coating, dip coating, blade coating, reverse-roll coating, air-knife coating and extrusion coating.

In making a lithographic printing plate from the lithographic photosensitive printing plate of the invention, toner images are formed on the lithographic photosensitive printing plate by the electrophotographic process, light active to the quinonediazide compound is irradiated and, then non-image portions of the photoconductive layer are removed with an alkaline etchant.

The developer (toner) used in the electrophotographic process is preferably a hydrophobic and ink-receptive one and contains a high-molecular compound such as a polystyrene resin, polyester resin (e.g., amino-group-containing acrylic ester, long-chain acrylic ester), acrylic resin (e.g., resin containing a phenolic hydroxyl group or sulfo group), epoxy resin, vegetable-oil-modified alkyd resin, cyclized rubber, asphalt, and polyvinyl chloride. Further, there may also be contained, within the limits not harmful to toner's graininess, a colorant such as carbon black, a Nigrosine pigment, Carmine 6B, Phthalocyanine Blue, Benzidine Yellow or Phthalocyanine Green; a UV absorbent; and a charge controlling agent such as a metal salt of fatty or naphthenic acid, metal-containing pigment or sulfonate.

In the photomechanical processing, a liquid toner, which comprises an insulating liquid carrier dispersing therein toner particles, is generally used for its capability of providing a high resolution. The transmission density of the toner image portion to light active to the quinonediazide compound is not less than 0.5, preferably not less than 0.8.

To prepare a liquid toner, the toners disclosed in Japanese Pat. O.P.I. Pub. Nos. 210345/1982, 210346/1982, 194040/1983, 194041/1983, 6954/1985, 36759/1986 and 35370/1987 can be used.

In the invention, a dry toner used in the usual plain paper copier also works effectively.

After forming toner images as above, the photosensitive lithographic printing plate of the invention is subjected to overall exposure to light active to the quinonediazide compound using a halogen lamp, xenon lamp, or mercury lamp for increasing the solubility of non-image portions to an etchant, and then subjected to etching.

Usable methods for etching are not limited to specific ones, and there can be employed, for example, the fresh solution supply method described in Japanese Pat. O.P.I. Pub. No. 32890/1991, the shower circulation supply method disclosed in Japanese Pat. O.P.I. Pub. No. 25477/1983, and the dipping method described in Japanese Pat. O.P.I. Pub. No. 235964/1991 and in Japanese Pat. Appl. No. 96773/1990.

The etchant is not particularly limited and may contain an alkali agent, organic solvent, surfactant and chelating agent. Examples of suitable etchants are those described in Japanese Pat. Appl. Nos. 32010/1990 and 203374/1991.

After completion of etching, washing or rinsing is carried out. Further, rubberizing may be performed.

The toner on image portions may be removed after overall exposure to light active to the quinonediazide compound. The removing of toner may be carried out before or after each of the steps comprising etching, washing, rinsing and gumming.

To remove the toner, the methods disclosed in Japanese Pat. Appl. No. 245105/1991 and Japanese Pat. O.P.I. Pub. Nos. 66863/1981, 130766/1981 can be used.

The methods for rinsing and rubberizing can be seen in Japanese Pat. O.P.I. Pub. No. 271256/1988 and Japanese Pat. O.P.I. Pub. No. 77950/1991. Further, the rinsing method or rubberizing method used in the processing of positive or negative PS plates can also be used without any modification.

EXAMPLES

The invention is illustrated in detail by the following examples, in which parts are by weight unless otherwise stated.

EXAMPLE 1

A 0.30-mm thick aluminium plate (JIS 1100) was degreased in a caustic soda solution, and electrolytically grained in 0.3 mol/l hydrochloric acid solution at 30° C. for 30 seconds using an alternating current of a current density of 50 A/dm$^2$. Then it was subjected to desmut treatment in 5% caustic soda solution at 60° C. for 10 seconds, anodized in 20% sulfuric acid solution at 20° C. for 1 minute at a current density of 3 A/dm$^2$, followed by washing. Further, the plate was dipped in hot water (80° C.) for 30 seconds and then dried in warm air, so that an aluminium support for a photosensitive lithographic printing plate was obtained.

Subsequently, a photoconductive layer coating solution, prepared by dispersing the following composition for 3 hours in a sand grinder, was coated on the support with a wire bar and dried for 3 minutes at 90° C. and for 48 hours at 55° C. A photosensitive lithographic printing plate of Example 1 was so prepared. The thickness of the photoconductive layer was 40 mg/dm² and the content of the sulfonic acid residue in the esterified compound of o-naphthoquinonediazide sulfonic acid with a phenol resin was $0.48 \times 10^{-3}$ mol per gram of the photoconductive layer.

| Photoconductive layer coating solution | |
|---|---|
| ε-Type copper phthalocyanine (Liophoton-EK made by Toyo Ink Mfg. Co.) | 15 parts |
| Esterified compound (esterified ratio = 33%) between p-cresol-formaldehyde polycondensation novolak resin (Mw: 2000) and o-naphthoquinonediazido-4-sulfonic acid | 22.5 parts |
| Phenol/m-cresol/p-cresol-formaldehyde polycondensation novolak resin [charging ratio (by weight) = 10:50:40] | 62.5 parts |
| Ethyl cellosolve | 400 parts |

EXAMPLES 2 AND 3, COMPARATIVE EXAMPLES 1 AND 2

The procedure of Example 1 was repeated, except that the content of the sulfonic acid residue per gram of the photoconductive layer was varied as shown in Table 1 in place of the content of o-naphthoquinonediazido-4-sulfonic acid in the esterified compound with the p-cresol-formaldehyde polycondensation novolak resin (Mw: 2000) used in the photoconductive layer coating solution of Example 1. At that time, the change in content of the quinonediazide compound was compensated with the novolak resin; therefore, the content of the photoconductor was not changed.

EXAMPLES 4 TO 7, COMPARATIVE EXAMPLES 3 AND 4

The procedure of Example 1 was repeated, except that the content of sulfonic acid residue per gram of the photoconductive layer in the esterified compound between the p-cresol-formaldehyde polycondensation novolak resin (Mw: 2000) and o-naphthoquinonediazido-4-sulfonic acid used in the photoconductive layer coating solution of Example 1 as well as the content of the ε-type copper phthalocyanine were varied as shown in Table 1, and that the amount of the phenol/m-cresol/p-cresol-formaldehyde polycondensation novolak resin was changed so as to make the total amount of the ε-type copper phthalocyanine, novolak resin and quinonediazide compound equal to that in Example 1.

EXAMPLE 8

The procedure of Example 1 was repeated, except that the esterified compound of the p-cresol-formaldehyde polycondensation novolak resin (Mw: 2000) with o-naphthoquinonediazido-4-sulfonic acid used in the photoconductive layer coating solution of Example 1 was replaced with an esterified compound of the p-cresol-formaldehyde polycondensation novolak resin (Mw: 2000) with o-naphthoquinonediazido-5-sulfonic acid.

EXAMPLE 9

The procedure of Example 1 was repeated, except that the esterified compound between the p-cresol-formaldehyde polycondensation novolak resin (Mw: 2000) and o-naphthoquinonediazido-4-sulfonic acid used in the photoconductive layer coating solution of Example 1 was replaced with an esterified compound between a m-cresol-formaldehyde polycondensation novolak resin (Mw: 2000) and o-naphthoquinonediazido-4-sulfonic acid.

EXAMPLE 10

The procedure of Example 1 was repeated, except that the esterified compound of the p-cresol-formaldehyde polycondensation novolak resin (Mw: 2000) with o-naphthoquinonediazido-4-sulfonic acid used in the photoconductive layer coating solution of Example 1 was replaced with an esterified compound of the m-cresol-formaldehyde polycondensation novolak resin (Mw: 2000) with o-naphthoquinonediazido-5-sulfonic acid.

EXAMPLE 11

The procedure of Example 1 was repeated, except that the esterified compound of the p-cresol-formaldehyde polycondensation novolak resin (Mw: 2000) with o-naphthoquinonediazido-4-sulfonic acid used in the photoconductive layer of Example 1 was replaced with an esterified compound of a p-cresol-benzaldehyde polycondensation novolak resin (Mw: 2000) with o-naphthoquinonediazido-4-sulfonic acid.

EXAMPLE 12

The procedure of Example 1 was repeated, except that the esterified compound of the p-cresol-formaldehyde polycondensation novolak resin (Mw: 2000) with o-naphthoquinonediazido-4-sulfonic acid used in the photoconductive layer coating solution of Example 1 was replaced with an esterified compound of a phenol/p-cresol [charging ratio (by weight)=1:1)]-formaldehyde polycondensation novolak resin (Mw: 2000) with o-naphthoquinonediazido-4-sulfonic acid.

EXAMPLE 13

The procedure of Example 1 was repeated except that the composition of the photoconductive layer coating solution was change as follows:

| | |
|---|---|
| ![structure with Cl, N=N, HO, CONH-Ar-CF₃, naphthyl, subscript 2] | 15 parts |
| $(C_2H_5)_2N$—⟨⟩—CH(C$_3$H$_7$)—⟨⟩—$N(C_2H_5)_2$ | 2 parts |
| Phenol/m-cresol/p-cresol-formaldehyde novolak resin charging ratio = 10:50:40 (by weight) | 60.5 parts |
| Quinonediazide compound of Example 1 | 22.5 parts |
| Ethyl cellosolve | 350 parts |
| Tetrahydrofuran | 50 parts |

EXAMPLE 14

The procedure of Example 1 was repeated, except that the composition of the photoconductive layer coating solution was changed to the following one, and that an eluting solution of the following composition was used in the elution developing (elution with SDR-1 could not be carried out).

| Composition of photoconductive layer coating solution | |
|---|---|
| 2,5-Bis(4'-diethylaminophenyl)oxaziazole | 50 parts |
| Phenol/m-cresol/p-cresol-formaldehyde novolak resin [charging ratio (by weight) = 10:50:40] | 27.5 parts |
| Quinonediazide compound of Example 1 | 22.5 parts |
| Rhodamine B | 0.3 part |
| Ethyl cellosolve | 200 parts |
| Tetrahydrofuran | 200 parts |
| Composition of eluting solution | |
| Benzyl alcohol | 5 parts |
| Triethanolamine | 5 parts |
| Isopropanol | 30 parts |
| Potassium silicate A (SiO$_2$ conc. = 26 wt %, made by Nippon Chem.) | 5 parts |
| Potassium hydroxide (50%) | 5 parts |
| Water | 50 parts |

EXAMPLE 15

The procedure of Example 1 was repeated, except that the phenol/m-cresol/p-cresol-formaldehyde polycondensation novolak resin used in the photoconductive layer coating solution of Example 1 was replaced with a benzyl methacrylate/methacrylic acid copolymer [charging ratio (by weight)=7:3, weight average molecular weight Mw=20000].

EXAMPLE 16

The procedure of Example 1 was repeated, except that the phenol/m-cresol/p-cresol-formaldehyde polycondensation novolak resin used in the photoconductive layer coating solution of Example 1 was replaced with a styrene/methacrylic acid copolymer [charging ratio (by weight)=7:3, Mw=20000].

EXAMPLE 17

The procedure of Example 1 was repeated, except that the phenol/m-cresol/p-cresol-formaldehyde polycondensation novolak resin used in the photoconductive layer coating solution of Example 1 was replaced with a methyl methacrylate/methacrylic acid copolymer [charging ratio (by weight)=7:3, Mw=20000].

EXAMPLE 18

The procedure of Example 1 was repeated, except that the phenol/m-cresol/p-cresol-formaldehyde polycondensation novolak resin used in the photoconductive layer coating solution of Example 1 was replaced with a hydroxyphenyl methacrylamide/acrylonitrile/-methyl methacrylate/ethyl acrylate copolymer [charging ratio (by weight)=30:30:35:5, Mw=20000].

EXAMPLE 19

The procedure of Example 1 was repeated, except that the phenol/m-cresol/p-cresol-formaldehyde polycondensation novolak resin used in the photoconductive layer coating solution of Example 1 was replaced with a mixture of a hydroxyphenyl methacrylamide/acrylonitrile/methyl methacrylate/ethyl acrylate copolymer [charging ratio (by weight)=30:30:35:5, Mw=20000] and the novolak resin [mixing ratio (by weight)=7:3].

EXAMPLE 20

The procedure of Example 1 was repeated, except that the phenol/m-cresol/p-cresol-formaldehyde polycondensation novolak resin used in the photoconductive layer coating solution of Example 1 was replaced with a poly-p-hydroxystyrene (Mw=20000).

EXAMPLE 21

The procedure of Example 1 was repeated, except that the phenol/m-cresol/p-cresol-formaldehyde polycondensation novolak resin used in the photoconductive layer coating solution of Example 1 was replaced with a styrene/maleic anhydride copolymer (Mw=20000).

EXAMPLE 22

The procedure of Example 1 was repeated, except that the phenol/m-cresol/p-cresol-formaldehyde polycondensation novolak resin used in the photoconductive layer coating solution of Example 1 was replaced with a vinyl acetate/crotonic acid copolymer (Mw=20000).

EXAMPLE 23

The procedure of Example 1 was repeated, except that 80% of the phenol/m-cresol/p-cresol-formaldehyde polycondensation novolak resin used in the photoconductive layer coating solution of Example 1 was replaced with a benzyl methacrylate/methacrylic acid copolymer [charging ratio (by weight)=7:3, weight average molecular weight Mw=20000].

EXAMPLE 24, EXAMPLE 25

(same as Example 23)

The lithographic photosensitive printing plates of Examples 1 to 25 and Comparative Examples 1 to 4 were evaluated in accordance with the following procedure.

Electrophotographic Properties

The sensitivity, dark decay and residual voltage were measured through SP-428 manufactured by Kawaguchi Denki. The results are set forth in Tables 1 and 2, where the sensitivity is shown by an exposure (lux·sec) equal to half the initial voltage 200 V (halved by photo-decay), the dark decay is expressed by k of an exp(−kt) curve obtained by the least square method as an approximation of the attenuation from the initial voltage 200 V in the dark, and the residual voltage is shown by a voltage after giving an exposure of 120 lux·sec equal to the initial voltage 200V. In each of the above properties, the property becomes better as the value becomes smaller.

Printing Properties

The above photosensitive lithographic printing plates were processed in the following manner. First, these were each charged to surface voltage+200 V with a SUKOTORON, imagewise exposed at a scanning speed of 250 m/sec using a semiconductor laser having an output of 3 mW to form a static latent image thereon, and immediately developed with the liquid developing apparatus disclosed in Japanese Pat. Exam. Pub. No. 19952/1990 to form a toner image. After drying, these were subjected to heat setting at 130° C. for 10 seconds.

The solution developer used was prepared by dispersing, with glass beads for 5 hours, a mixture of

| | |
|---|---|
| Octadecyl methacrylate/methacrylic acid copolymer (copolymerization ratio = 90:10) | 1 part |
| ISOPER G (made by Exxon Inc.) | 5 parts |
| Carbon black (MA-100 made by Mitsubishi Kasei Corp.) | 1 part | and, after adding thereto a solution of

| | |
|---|---|
| Polyethylene (average molecular weight 2000, Sanwax 151P made by Sanyo Chem. Ind.) | 1 part |
| ISOPER G (made by Exxon Inc.) | 4 parts | the mixture was further dispersed for 10 hours. The dispersion obtained was diluted with ISOPER G to a solid matter concentration of 0.3 w/w %.

After thus forming a toner image on each photosensitive lithographic printing plate, the plate was overall irradiated with ultraviolet light to a total amount of 3 J/m² using a mercury lamp, followed by etching of the non-image portion by use of the apparatus disclosed in Japanese Pat. O.P.I. Pub. No. 74566/1983. In the elution, a Positive PS Plate Developer SDR-1 (product of Konica Corp.) diluted with water to 1/6 was used as an etchant. Elution was carried out by feeding the eluting solution on the plate at a temperature of 27° C. and at a rate of 15 l/m². After the elution, the 1st washing, 2nd washing and rubberizing were performed to obtain a lithographic printing plate.

The lithographic printing plate prepared as above was evaluated for printing properties as follows: Side etch: The side etching rate was determined by measuring a side etch width of the photoconductive layer bearing the toner image at a eluting time of 15 sec, 30 sec, 45 sec and 60 sec, plotting the measured values and reading a side etch width (in $\mu$m) per second from the slope of a linear expression approximated from the plotted values.

Adhesion of photoconductive layer components on the surface of the support: Visual examination was conducted using the following three-grade criterion.
A: no adhesion observed
B: slight adhesion observed
C: adhesion observed Staining in prints: Prints were prepared using the above obtained printing plate and staining thereon was visually examined.
A: no stain observed
B: slight stain observed
C: stain observed The evaluation results are shown in Tables 1 and 2.

TABLE 1

| | Content of Sulfonic Acid Residue ($\times 10^{-3}$ mol) | Photo-conductor Amount (parts) | Electrophotographic Properties | | | Side Etching Rate ($\mu$m/sec) | Adhesion of Photo-conductive Layer Components to Grains | Straining in Prints |
|---|---|---|---|---|---|---|---|---|
| | | | Sensitivity (lux·sec) | Coefficient of Dark Attenuation (k) | Residual Voltage (V) | | | |
| Example 1 | 0.48 | 15 | 22 | 0.036 | 10 | 0 | A | A |
| Example 2 | 0.40 | 15 | 23 | 0.035 | 8 | 0.05 | A | A |
| Example 3 | 1.60 | 15 | 15 | 0.055 | 15 | 0 | A | A |
| Comp. Example 1 | 0.36 | 15 | 26 | 0.034 | 8 | 0.6 | A | A |
| Comp. Example 2 | 0.18 | 15 | 28 | 0.031 | 7 | 0.8 | A | A |
| Example 4 | 0.48 | 5 | 29 | 0.036 | 18 | 0 | A | A |
| Example 5 | 0.48 | 10 | 26 | 0.036 | 15 | 0 | A | A |
| Example 6 | 0.48 | 20 | 17 | 0.036 | 8 | 0 | A | A |
| Example 7 | 0.48 | 30 | 12 | 0.037 | 6 | 0 | B-A | B-A |
| Comp. Example 3 | 0.36 | 30 | 17 | 0.034 | 6 | 0.5 | B-A | B-A |
| Comp. Example 4 | 0.18 | 35 | 17 | 0.033 | 5 | 0.7 | B | B |
| Example 8 | 0.48 | 15 | 26 | 0.033 | 12 | 0 | A | A |
| Example 9 | 0.48 | 15 | 23 | 0.034 | 9 | 0.05 | A | A |
| Example 10 | 0.48 | 15 | 27 | 0.033 | 12 | 0.05 | A | A |
| Example 11 | 0.48 | 15 | 22 | 0.033 | 10 | 0 | A | A |
| Example 12 | 0.48 | 15 | 25 | 0.032 | 10 | 0.05 | A | A |

TABLE 2

| | Content of Sulfonic Acid Residue ($\times 10^{-3}$ mol) | Photo-conductor Amount (parts) | Electrophotographic Properties | | | Side Etching Rate ($\mu$m/sec) | Adhesion of Photo-conductive Layer Components to Grains | Staining in Prints |
|---|---|---|---|---|---|---|---|---|
| | | | Sensitivity (lux·sec) | Coefficient of Dark Attenuation (k) | Residual Voltage (V) | | | |
| Example 13 | 0.48 | 15 | 26 | 0.050 | 18 | 0 | A | A |
| Example 14 | 0.48 | 50 | 28 | 0.060 | 20 | 0.05 | B-A | B |
| Example 15 | 0.48 | 15 | 16 | 0.030 | 25 | 0 | B-A | B |
| Example 16 | 0.48 | 15 | 13 | 0.023 | 15 | 0 | A | B-A |
| Example 17 | 0.48 | 15 | 13 | 0.038 | 15 | 0 | A | B-A |
| Example 18 | 0.48 | 15 | 15 | 0.035 | 13 | 0 | A | A |
| Example 19 | 0.48 | 15 | 17 | 0.035 | 13 | 0 | A | A |
| Example 20 | 0.48 | 15 | 21 | 0.036 | 10 | 0 | A | A |
| Example 21 | 0.48 | 15 | 19 | 0.031 | 10 | 0 | A | B-A |
| Example 22 | 0.48 | 15 | 24 | 0.030 | 13 | 0 | A | B-A |
| Example 23 | 0.48 | 15 | 17 | 0.032 | 24 | 0 | A | B-A |
| Example 24 | 0.48 | 15 | 14 | 0.026 | 17 | 0 | A | A |
| Example 25 | 0.48 | 15 | 14 | 0.041 | 17 | 0 | A | A |

It can be seen in Tables 1 and 2 that the lithographic photosensitive printing plates of the invention were excellent in electrophotographic properties, side etch inhibiting capability, residual pigments and anti-staining property. The adhesion of layer components and the stain in printing were prevented in Example 7 and Comparative Example 3 using an exposure of 3.5 J/m², and in Comparative Example 4 using an exposure of 4 J/m².

EXAMPLES 26 TO 30

The procedure of Example 1 was repeated to make photosensitive lithographic printing plates, except that propylene glycol monomethyl ether, propylene glycol monomethyl ether acetate, diethylene glycol dimethyl ether, diethylene glycol methyl ethyl ether and ethylene glycol monopropyl ether were used instead of ethylene glycol monoethyl ether. The thus obtained printing plates were processed and evaluated in the same manner as in Example 1. The same results as those of Example 1 were obtained.

What is claimed is:

1. A photosensitive lithographic printing plate comprising a conductive support and provided thereon, a photoconductive layer of a composition comprising a photoconductor and an esterified compound of o-naphthoquinonediazide sulfonic acid with a phenol resin, wherein the phenol resin is a polycondensation compound of m-cresol or p-cresol with an aldehyde or a ketone, and the content of the o-naphthoquinonediazide sulfonic acid residue is $0.4 \times 10^{-3}$ to $3.0 \times 10^{-3}$ mole per gram of the photoconductive layer.

2. A photosensitive lithographic printing plate comprising a conductive support and provided thereon, a photoconductive layer of a composition comprising a photoconductor and an esterified compound of o-naphthoquinonediazide sulfonic acid with a phenol resin, wherein the phenol resin is a polycondensation compound of a monovalent phenol with an aldehyde or a ketone, the sulfonic acid group is present at the 4-position of the o-naphthoquinonediazide sulfonic acid and the content of the o-naphthoquinonediazide sulfonic acid is $0.4 \times 10^{-3}$ to $3.0 \times 10^{-3}$ mol per gram of the photoconductive layer.

3. The printing plate of claim 1, wherein the monovalent phenol is p-cresol.

4. The printing plate of claim 1, wherein the condensation ratio of the o-naphthoquinonediazide sulfonic acid to the hydroxyl group in the phenol resin is 15 to 80 mole %.

5. The printing plate of claim 1, wherein the photoconductive layer further contains an alkali-soluble resin which is a polycondensation product of a monovalent phenol with an aldehyde or a ketone.

6. The printing plate of claim 5, wherein the alkali-soluble resin comprises a novolak resin and the novolak resin is contained in an amount of 5 to 70% by weight of the photoconductive layer.

7. The printing plate of claim 5, wherein the novolak resin comprises a polycondensation product of phenol, m-cresol and p-cresol with formaldehyde.

8. The printing plate of claim 1, wherein the photoconductor is contained in an amount of 3 to 50% by weight of the photoconductive layer.

9. The printing plate of claim 1, wherein the sulfonic acid group is present at the 4- or 5-position of the o-naphthoquinonediazide sulfonic acid.

10. The printing plate of claim 1, wherein the printing plate is manufactured by the method comprising the steps of:

dissolving the composition in a solvent, the solvent being selected from the group consisting of propylene glycol monoalkyl ether, the alkyl of which has 1 to 3 carbon atoms; propylene glycol monoalkyl ether acetate, the alkyl of which has 1 to 3 carbon atoms; diethylene glycol dialkyl ether, the alkyl of which has 1 to 2 carbon atoms; and ethylene glycol monopropyl ether;

coating the resulting solution on the support+; and drying the coated solution to form the photoconductive layer.

11. The printing plate of claim 10, wherein the solvent is selected from the group consisting of propylene glycol monomethyl ether, propylene glycol monomethyl ether acetate, diethylene glycol dimethyl ether, diethylene glycol methyl ethyl ether and ethylene glycol monopropyl ether.

12. The printing plate of claim 1, wherein the photoconductor is an organic photoconductive pigment.

13. The printing plate of claim 12, wherein the organic photoconductive pigment is phthalocyanine pigment.

14. The printing plate of claim 12, wherein the organic photoconductive pigment is ε-type phthalocyanine pigment.

* * * * *

UNITED STATES PATENT AND TRADEMARK OFFICE
CERTIFICATE OF CORRECTION

PATENT NO. : 5,437,952
DATED : August 01, 1995
INVENTOR(S) : Katsura HIRAI et al It is certified that error appears in the above-indentified patent and that said Letters Patent is hereby corrected as shown below:

Claim 10, Column 16, Line 29, delete "+".

Signed and Sealed this

Sixth Day of August, 1996

Attest:

BRUCE LEHMAN

*Attesting Officer*   *Commissioner of Patents and Trademarks*